United States Patent [19]

Ichikawa

[11] Patent Number: 5,689,132
[45] Date of Patent: Nov. 18, 1997

[54] PROTECTIVE CIRCUIT FOR SEMICONDUCTOR INTEGRATED CIRCUIT

[75] Inventor: Tsutomu Ichikawa, Kanagawa, Japan

[73] Assignee: Sony Corporation, Tokyo, Japan

[21] Appl. No.: 585,874

[22] Filed: Jan. 16, 1996

[30] Foreign Application Priority Data

Jan. 17, 1995 [JP] Japan .................................. 7-004577

[51] Int. Cl.⁶ .................................................. H01L 23/62
[52] U.S. Cl. ........................... 257/357; 257/360; 257/361; 257/362
[58] Field of Search .................................. 257/357, 361, 257/362, 355, 356, 360

[56] References Cited

U.S. PATENT DOCUMENTS 4,821,096  4/1989  Maloney .............................. 257/360 X

FOREIGN PATENT DOCUMENTS

| 62-81053 | 4/1987 | Japan | 257/357 |
| 1061047 | 3/1989 | Japan | 257/360 |
| 4071274 | 3/1992 | Japan | 257/360 |

*Primary Examiner*—William Mintel
*Attorney, Agent, or Firm*—Hill, Steadman & Simpson

[57] ABSTRACT

A protective circuit for a semiconductor integrated circuit having a MOS transistor is constructed of a protective device having a first conducting type of protective device region provided in the surface of a substrate and a second conducting type of first diffused part and second diffused part provided in the surface of the protective device region. The first diffused part is connected to a power line of the MOS transistor, and the second diffused part is connected to a signal line between an external input terminal and the MOS transistor. The bipolar operation of the protective device allows electric charge accumulated in the power line to be discharged from the external input terminal, and also allows electric charge accumulated in the external input terminal to be discharged from the power line. Accordingly, the occurrence of electrostatic breakdown in the semiconductor integrated circuit can be prevented.

11 Claims, 4 Drawing Sheets

FIG. I 5,689,132

PROTECTIVE CIRCUIT FOR SEMICONDUCTOR INTEGRATED CIRCUIT

BACKGROUND OF THE INVENTION

The present invention relates to a protective circuit for a semiconductor integrated circuit having MOS transistors.

A semiconductor integrated circuit comprised; of MOS transistors is provided with a protective circuit for protecting an internal circuit.

FIG. 4 shows a protective circuit in the related art. Referring to FIG. 4, reference numeral 81 denotes a protective device forming an nMOS transistor as the protective circuit. A drain electrode D of the protective device 81 is connected to a signal line 84 between an internal circuit having a MOS transistor 82 and an external input terminal 83. A source electrode S, a gate electrode G, and a substrate electrode of the protective device 81 are grounded.

In the semiconductor integrated circuit having the protective circuit, positive static electricity accumulated in the external input terminal 83 is discharged from the grounding portion by a snap-back operation such that a parasitic npn bipolar transistor having an n-p-n structure of source-substrate-drain in the protective device 81 turns on. On the other hand, negative static electricity accumulated in the external input terminal 83 is discharged from the grounding portion by forward bias of the pn junction between the substrate and the drain in the protective device 81.

FIG. 5 shows another protective circuit provided on the output side of the semiconductor integrated circuit in the related art. As shown in FIG. 5, reference numeral 86 denotes a transistor for an output buffer connected to an external output terminal 85. The transistor 86 itself functions as the protective circuit.

In the semiconductor integrated circuit having the above protective circuits in the related art, it is possible to prevent electrostatic breakdown of the internal circuit due to charging of the external input terminal 83 or the external output terminal 85 as shown in a body charging model or a machine model.

However, the protective circuits in the related art have the following problems.

In recent years, package capacity has increased with a decrease in thickness of a gate oxide film and a decrease in size of the package, and electrostatic breakdown as shown in a package charging model or a device charging model tends to be accordingly increased.

In these charging models, electric charge is accumulated in an internal circuit including a power line and a ground line, and the electric charge accumulated is discharged from an external terminal in contact with a grounding conductor through a path having the lowest impedance. Accordingly, the discharging path is not necessarily the path passing through the protective device. In the case where a capacitive device comprised of a gate electrode and another electrode of a MOS transistor is present in the discharging path, a high voltage applied to a gate oxide film of the MOS transistor causes breakdown of the gate oxide film.

In a semiconductor integrated circuit wherein the power line and the ground line for the output transistor are different from those for the internal circuit, the impedance between the power line or the ground line for the internal circuit and the ground line or the power line for the output transistor becomes large. Accordingly, when electric charge accumulated in the power line or the ground line for the internal circuit is discharged from a source electrode of the transistor for the output buffer to an output terminal, a gate electrode of the transistor is broken.

SUMMARY OF THE INVENTION

It is accordingly an object of the present invention to provide a protective circuit for a semiconductor integrated circuit which can prevent the occurrence of electrostatic breakdown.

A protective circuit for a semiconductor integrated circuit according to a first aspect of the present invention is constructed a protective device having a first conducting type protective device region provided in the surface of a substrate and a second conducting type of a first diffused part and a second diffused part provided in the surface of the protective device region. The first diffused part of the protective device is connected to a power line or a ground line for a MOS transistor in the semiconductor integrated circuit, and the second diffused part of the protective device is connected to an external terminal.

A protective circuit for a semiconductor integrated circuit according to a second aspect of the present invention is constructed of a first protective device having a second conducting type of first and second diffused parts similar to the above protective device and a second protective device having a second conducting type of third and fourth diffused parts similar to the above protective device. The first diffused part of the first protective device is connected to a power line of a MOS transistor in the semiconductor integrated circuit, and the second diffused part of the first protective device is connected to an external terminal. The third diffused part of the second protective device is connected to a ground line of the MOS transistor, and the fourth diffused part of the second protective device is connected to the external terminal.

Preferably, the second diffused part of the first protective device and the fourth diffused part of the second protective device are connected to a signal line between the external terminal and the MOS transistor.

A protective circuit for a semiconductor integrated circuit according to a third aspect of the present invention is a protective circuit for a semiconductor integrated circuit having MOS transistors constituting an output buffer. The protective circuit is constructed of a first protective device having a second conducting type of first and second diffused parts similar to the above protective device and a second protective device having a second conducting type of third and fourth diffused part similar to the above protective device. The first diffused part of the first protective device is connected to an input signal line for a pull-up transistor of the MOS transistors constituting the output buffer. The third diffused part of the second protective device is connected to an input signal line for a pull-down transistor of the MOS transistors constituting the output buffer. The second diffused part of the first protective device and the fourth diffused part of the second protective device are connected to an external terminal.

Preferably, in the protective circuit for the semiconductor integrated circuit according to each of the first to third aspects of the present invention, the first conducting type is a p-type, and the second conducting type is an n-type. Further, the first conducting type of protective device region in each protective device is in a floating condition.

The protective device constituting the protective circuit for the semiconductor integrated circuit according to the first aspect of the present invention is comprised of the first conducting type of protective device region and the second conducting type of first and second diffused parts provided in the surface of the protective device region. Accordingly, the protective device forms a parasitic lateral bipolar transistor. Further, the first diffused part is connected to the power line or the ground line for the MOS transistor. Accordingly, electric charge accumulated in the power line or the ground line is moved from the first diffused part to the second diffused part of the protective device by the bipolar operation of the protective device without passing through the MOS transistor. Further, the second diffused part is connected to the external terminal. Accordingly, the above electric charge is discharged from the external terminal.

In the protective circuit for the semiconductor integrated circuit according to the second aspect of the present invention, the power line and the ground line for the MOS transistor are respectively connected to the first diffused part of the first protective device and the third diffused part of the second protective device. Accordingly, electric charge accumulated in the power line and the ground line is moved to the second diffused part of the first protective device and the fourth diffused part of the second protective device, respectively, as similarly to the above. The second diffused part and the fourth diffused part are connected to the external terminal. Accordingly, the above electric charge is discharged from the external terminal.

In the case where the second diffused part in the protective circuit according to the first aspect or the second diffused part and the fourth diffused part in the protective circuit according to the second aspect is or are connected to the signal line between the external terminal and the MOS transistor, electric charge accumulated in the external terminal is moved from the second diffused part to the first diffused part or from the fourth diffused part to the third diffused part by the bipolar operation of each protective device. Accordingly, the electric charge is discharged from the power line or the ground line.

In the protective circuit for the semiconductor integrated circuit according to the third aspect of the present invention, the input signal line for the pull-up transistor constituting the output buffer and the input signal line for the pull-down transistor constituting the output buffer are respectively connected to the first diffused part of the first protective device and the third diffused part of the second protective device. Accordingly, electric charge accumulated in each input signal line is moved to the second diffused part of the first protective device or the fourth diffused part of the second protective device without passing through each transistor. The second and fourth diffused parts are connected to the external terminal. Accordingly, the electric charge is discharged from the external terminal.

In the case where the first conducting type is set to a p-type and the second conducting type is set to an n-type in each protective circuit, each protective device becomes an npn bipolar transistor, resulting in easy operation as a protective device.

In the case where the first conducting type of protective device region is in a floating condition, the potential of the protective device region is easily changed, thereby allowing the parasitic bipolar transistor formed by each protective device to be operated at a lower voltage to discharge the electric charge.

Other objects and features of the invention will be more fully understood from the following detailed description and appended claims when taken with the accompanying drawings.

DETAILED DESCRIPTION OF THE PREFERRED EMBODIMENTS

Figure 1:
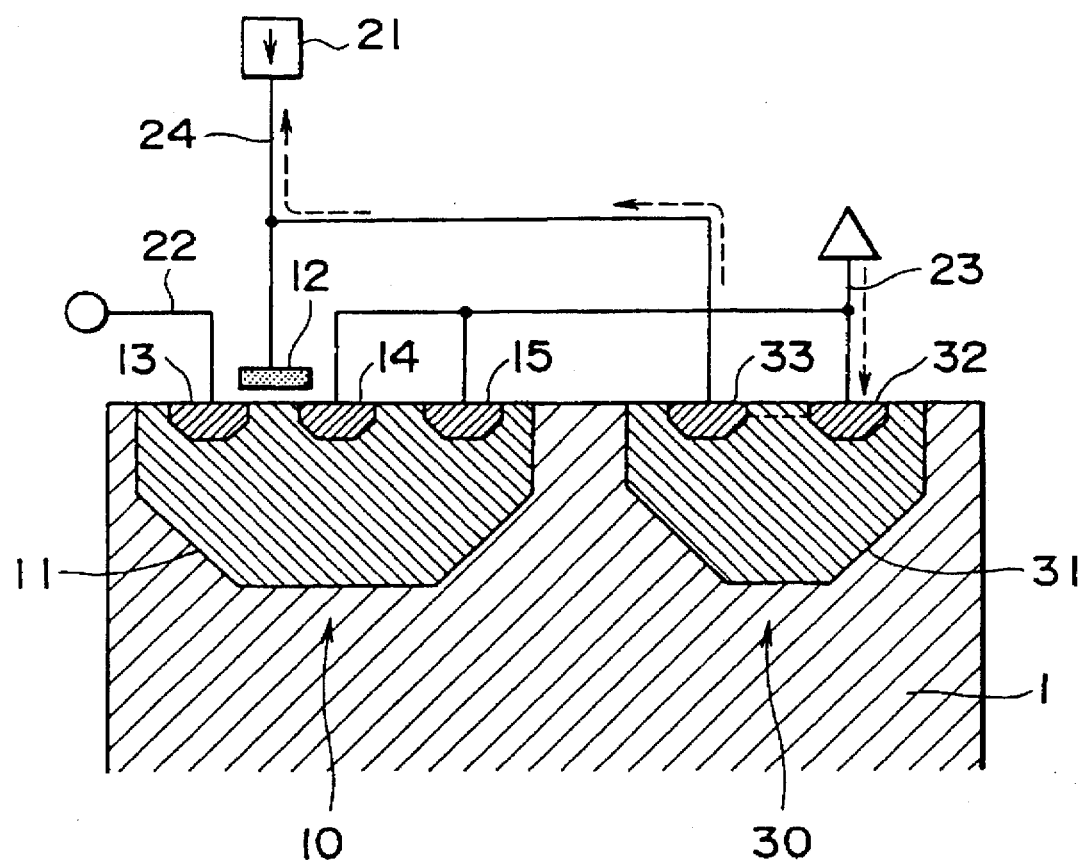
FIG. 1 is a view showing a protective circuit according to a first preferred embodiment of the present invention.

A first preferred embodiment of the present invention will now be described with reference to FIG. 1.

In this preferred embodiment, there will be described a protective circuit for protecting an input portion in a semiconductor integrated circuit having a MOS transistor.

A MOS transistor 10 located in an internal circuit of the input portion has a well diffused part 11 provided in the surface of a substrate 1. A gate electrode 12 provided over the surface of the well diffused part 11 is connected to an external input terminal 21. A drain electrode 13 provided in the surface of the well diffused part 11 is connected to an output signal line 22. A source electrode 14 and a substrate electrode 15 provided in the surface of the well diffused part 11 are connected to a power line 23 or a ground line. In this example shown, the source electrode 14 and the substrate electrode 15 are connected to the power line 23.

The protective circuit is constructed of a protective device 30 formed in the substrate 1 as a common substrate for the MOS transistor 10.

The protective device 30 has a first conducting type of protective device region 31 provided in the surface of the substrate 1 and a second conducting type of first diffused part 32 and second diffused part 33 provided in the surface of the protective device region 31. The first diffused part 32 is connected to the power line 23 for the MOS transistor 10. The second diffused part 33 is connected to a signal line 24 between the MOS transistor 10 and the external input terminal 21.

In this preferred embodiment, the first conducting type is a p-type and the second conducting type is an n-type. Further, the first conducting type of protective device region 31 is formed in a floating condition in the n-type substrate 1.

In the protective circuit having the above configuration, the protective device 30 is configured by forming the second conducting type of first and second diffused parts 32 and 33 in the first conducting type of protective device region 31. Accordingly, the protective device 30 forms a parasitic lateral bipolar transistor. Further, the power line 23 connected to the MOS transistor 10 in the input portion is connected to the first diffused part 32. Accordingly, since electric charge accumulated in the power line 23 flows in a lower-impedance path, the electric charge is moved from the first diffused part 32 to the second diffused part 33 as shown by a broken line arrow in FIG. 1 by the bipolar operation of the protective device 30. The second diffused part 33 is connected to the external input terminal 21. Accordingly, the electric charge is discharged from the external input terminal 21.

Further, there is no possibility of dielectric breakdown of a thin gate oxide film as in the case of using a MOS transistor as the protective device.

As described above, in the protective circuit of the above preferred embodiment, the electric charge accumulated in the power line 23 of the input portion in the semiconductor integrated circuit by package charging or device charging, for example, does not pass through the MOS transistor 10, but is discharged from the external input terminal 21. Accordingly, it is possible to prevent the occurrence of electrostatic breakdown of a gate oxide film of the MOS transistor 10 due to package charging or device charging in the input portion of the internal circuit.

Further, the protective device 30 has an npn structure and the protective device region 31 is in a floating condition. Accordingly, the potential of the base in the parasitic bipolar transistor is easily changed to thereby facilitate discharging of the electric charge.

Further, in the above protective circuit, the second diffused part 33 is connected to the signal line 24 between the MOS transistor 10 and the external input terminal 21. Accordingly, electric charge accumulated in the external input terminal 21 is moved from the second diffused part 33 to the first diffused part 32 by the bipolar operation of the protective device 30, and is then discharged from the power line 23. Accordingly, electrostatic breakdown as shown in a body charging model or a machine model in the input portion can also be prevented.

In the case where the source electrode 14 and the substrate electrode 15 of the MOS transistor 10 in the input portion is connected to the ground line in the first preferred embodiment, the first diffused part 32 of the protective device 30 is connected to the ground line. Also in this case as similar to the above, electric charge accumulated in the ground line is discharged from the external input terminal 21, and electric charge accumulated in the external input terminal 21 is discharged from the ground line. Accordingly, similar to the above, it is possible to prevent the occurrence of electrostatic breakdown as shown in a package charging model or a device charging model and the occurrence of electrostatic breakdown as shown in a body charging model or a machine model in the input portion of the semiconductor integrated circuit.

Figure 2:
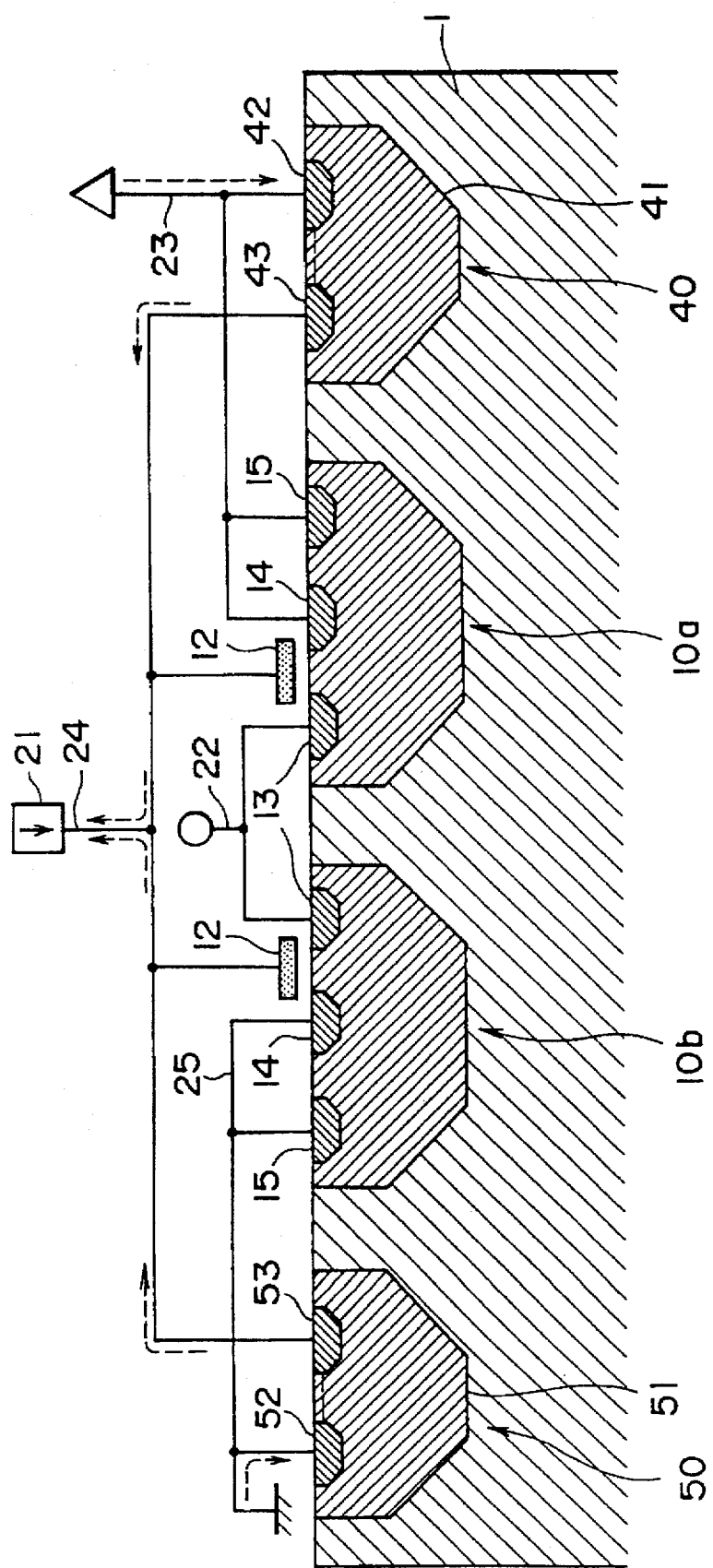
FIG. 2 is a view showing a protective circuit according to a second preferred embodiment of the present invention.

A protective circuit for a semiconductor integrated circuit according to a second preferred embodiment of the present invention will now be described with reference to FIG. 2. The protective circuit for the semiconductor integrated circuit according to the second preferred embodiment is constructed of protective circuits provided on the power line side and the ground line side of MOS transistors constituting an input portion in the semiconductor integrated circuit.

First and second MOS transistors 10a and 10b constituting an input buffer having a CMOS configuration, for example, are located in the input portion. A source electrode 14 and a substrate electrode 15 of the first MOS transistor 10a formed as a pMOS transistor are connected to a power line 23. A source electrode 14 and a substrate electrode 15 of the second MOS transistor 10b formed as a nMOS transistor are connected to a ground line 25. As similar to the first preferred embodiment, gate electrodes 12 of the transistors 10a and 10b are connected to a signal line 24 between an external input terminal 21 and the transistors 10a and 10b, and drain electrodes 13 of the transistors 10a and 10b are connected to an output signal line 22.

The protective circuit for protecting the input portion configured above is composed of a first protective device 40 having a first protective device region 41 and first and second diffused parts 42 and 43 and a second protective device 50 having a second protective device region 51 and third and fourth diffused parts 52 and 53. The configuration and the conducting type of each protective device region and each diffused part are similar to those in the first preferred embodiment.

The first diffused part 42 of the first protective device 40 is connected to the power line 23, and the third diffused part 52 of the second protective device 50 is connected to the ground line 25. The second diffused part 43 and the fourth diffused part 53 are connected to the signal line 24 between the external input terminal 21 and the gate electrodes 12.

In the protective circuit according to the second preferred embodiment, as similar to the first preferred embodiment, electric charge accumulated in the power line 23 and the ground line 25 in the input portion of the semiconductor integrated circuit is discharged from the external input terminal 21 through the first protective device 40 and the second protective device 50. Further, electric charge accumulated in the external input terminal 21 is discharged from the power line 23 or the ground line 25 through the first protective device 40 or the second protective device 50.

Accordingly, as similar to the first preferred embodiment, it is possible to prevent the occurrence of electrostatic breakdown as shown in a package charging model or a device charging model and the occurrence of electrostatic breakdown as shown in a body charging model or a machine model in the input portion of the semiconductor integrated circuit.

The protective circuit for the semiconductor integrated circuit according to the first and second preferred embodiments may be applied to an output portion of the semiconductor integrated circuit.

In this case, the second diffused part of the protective device or the second and fourth diffused parts of the first and second protective devices is or are connected to a signal line between each MOS transistor of the output portion and an external output terminal.

In the protective circuit in this case, electric charge accumulated in a power line and a ground line in the output portion of the semiconductor integrated circuit is discharged from the external output terminal through each protective device. Further, electric charge accumulated in the external output terminal is discharged from the power line or the ground line through each protective device.

Accordingly, it is possible to prevent the occurrence of electrostatic breakdown as shown in a package charging model or a device charging model and the occurrence of electrostatic breakdown as shown in a body charging model or a machine model in the output portion of the semiconductor integrated circuit.

Figure 3:
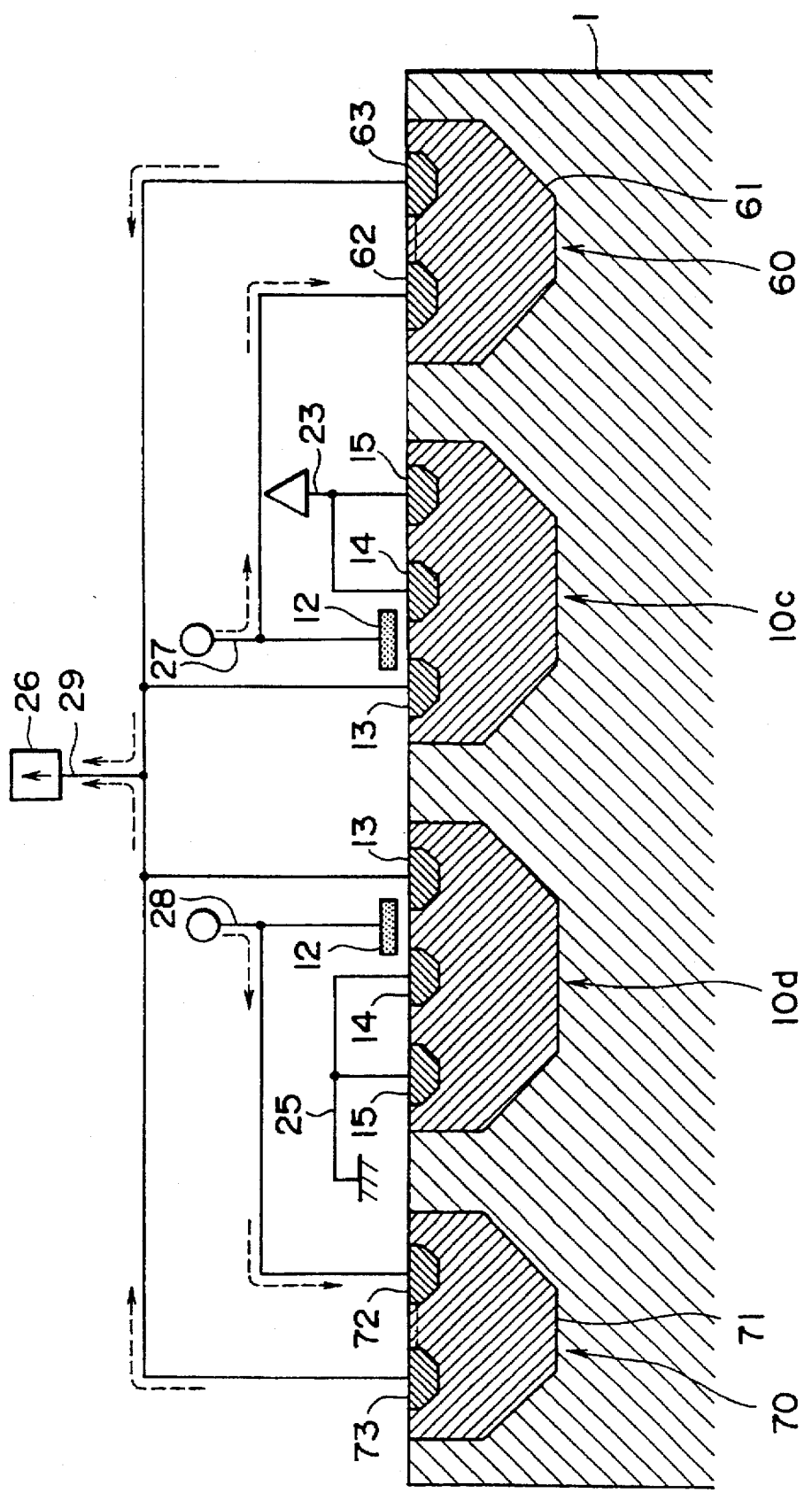
FIG. 3 is a view showing a protective circuit according to a third preferred embodiment of the present invention.
Figure 4:
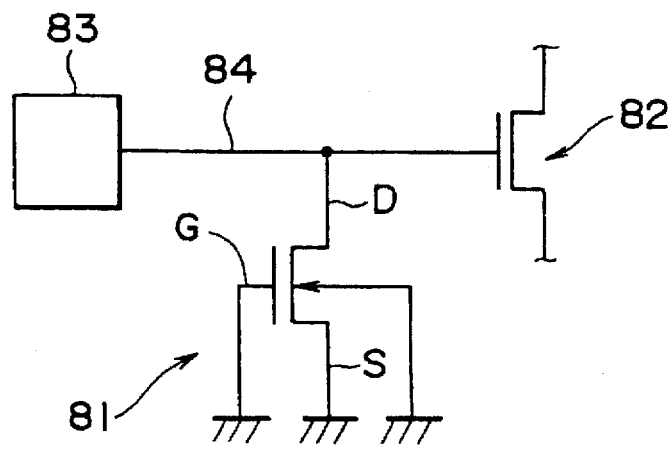
FIG. 4 is a diagram showing a protective circuit in the related art.
Figure 5:
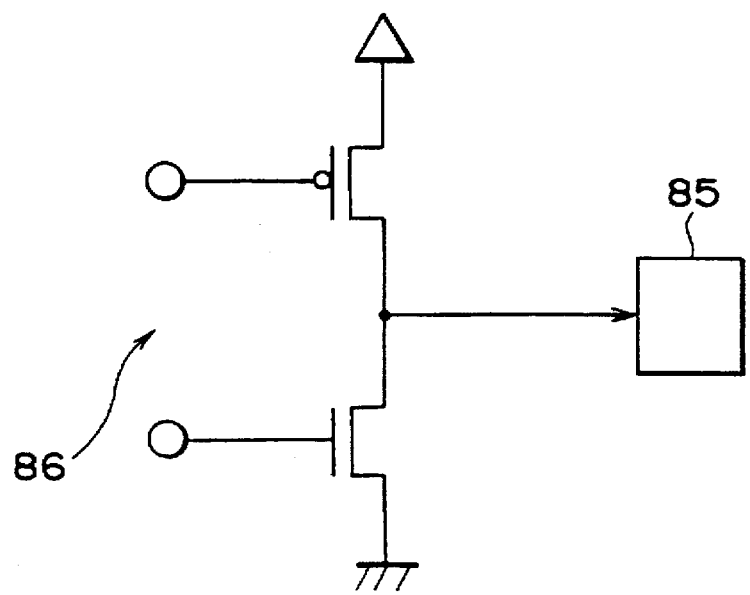
FIG. 5 is a diagram showing another protective circuit in the related art.

A protective circuit for a semiconductor integrated circuit according to a third preferred embodiment of the present invention will now be described with reference to FIG. 3.

The protective circuit for the semiconductor integrated circuit according to the third preferred embodiment is a protective circuit for protecting an output buffer in a semiconductor integrated circuit having MOS transistors constituting the output buffer.

The output buffer in the semiconductor integrated circuit has a CMOS configuration, for example, composed of a pMOS transistor as a pull-up transistor 10c and an nMOS transistor as a pull-down transistor 10d.

The output buffer may have an nMOS configuration.

The circuit configuration of the output buffer is such that gate electrodes 12 of the transistors 10c and 10d are connected to input signal lines 27 and 28 in an internal circuit, respectively, and drain electrodes 13 of the transistors 10c and 10d are connected to an external output terminal 26. Further, a source electrode 14 and a substrate electrode 15 of the pull-up transistor 10c are connected to a power line 23, and a source electrode 14 and a substrate electrode 15 of the pull-down transistor 10d are connected to a ground line 25.

The protective circuit for the output buffer configured above is composed of a first protective device 60 and a second protective device 70. The first protective device 60 has a first protective device region 61 and first and second diffused parts 62 and 63. The second protective device 70 has a second protective device region 71 and third and fourth diffused parts 72 and 73. The configuration and the conducting type of each protective device region and each diffused part are similar to those in the second preferred embodiment.

The first diffused part 62 of the first protective device 60 and the third diffused part 72 of the second protective device 70 are connected to the input signal lines 27 and 28, respectively. Further, the second diffused part 63 of the first protective device 60 and the fourth diffused part 73 of the second protective device 70 are connected to a signal line 29 between the external output terminal 26 and the transistors 10c and 10d.

In the protective circuit configured above, the input signal lines 27 and 28 of the transistors 10c and 10d constituting the output buffer are connected to the first diffused part 62 of the first protective device 60 and the third diffused part 72 of the second protective device 70, respectively. Accordingly, electric charge accumulated in the internal circuit of the semiconductor integrated circuit is input from the input signal lines 27 and 28 into the protective devices 60 and 70 as shown by broken line arrows in FIG. 3. Then, the electric charge is discharged from the external output terminal 26 by the bipolar operation of the protective devices 60 and 70.

Accordingly, the discharging of the electric charge accumulated in the internal circuit allows prevention of electrostatic breakdown of gate oxide films of the MOS transistors 10c and 10d constituting the output buffer.

Each protective device constituting the protective circuit described in the first to third preferred embodiments can be formed by using the same mask as that used in forming the diffused part of the nMOS transistor. Accordingly, the protective circuit can be formed without an increase in steps of a usual CMOS process.

As described above, according to the protective circuit for the semiconductor integrated circuit according to the first aspect of the present invention, the protective device is composed of the first conducting type of protective device region and the second conducting type of first and second diffused parts formed in this region, and the first and second diffused parts are connected to the power line or the ground line of the MOS transistor and the external terminal, respectively. With this arrangement, electric charge accumulated in the power line or the ground line can be discharged from the external terminal by the bipolar operation of the protective device without passing through the MOS transistor. Accordingly, it is possible to prevent the occurrence of electrostatic breakdown due to a package charging model or a device charging model.

According to the protective circuit for the semiconductor integrated circuit according to the second aspect of the present invention, the first diffused part of the first protective device similar to the above protective device is connected to the power line of the MOS transistor, and the third diffused part of the second protective device similar to the above protective device is connected to the ground line. With this arrangement, electric charge accumulated in the power line and the ground line can be discharged from the external terminal through the first and second protective devices. Accordingly, the occurrence of electrostatic breakdown as shown in a package charging model or a device charging model can be prevented.

Furthermore, the second diffused part of the first protective device and the fourth diffused part of the second protective device are connected to the signal line between the external terminal and the MOS transistors. With this arrangement, electric charge accumulated in the external terminal can be discharged from the power line or the ground line by the bipolar operation of each protective device. Accordingly, not only the electrostatic breakdown as shown in the package charging model or the device charging model, but also electrostatic breakdown as shown in a body charging model or, a machine model can be prevented at the same time.

According to the protective circuit for the semiconductor integrated circuit according to the third aspect of the present invention, the first diffused part of the first protective device similar to the above protective device is connected to the input signal line of the pull-up transistor constituting the output buffer, and the third diffused part of the second protective device similar to the above protective device is connected to the input signal line of the pull-down transistor constituting the output buffer. With this arrangement, electric charge accumulated in the internal circuit can be discharged from the external terminal. Accordingly, the occurrence of electrostatic breakdown of the transistors constituting the output buffer can be prevented.

While the invention has been described with reference to specific embodiments, the description is illustrative and is not to be construed as limiting the scope of the invention. Various modifications and changes may occur to those skilled in the art without departing from the spirit and scope of the invention as defined by the appended claims.

What is claimed is:

1. A protective circuit for a semiconductor integrated circuit, comprising:

at least one transistor provided on a substrate;

a first conducting type of region provided on said substrate; and a second conducting type first diffused part and second diffused part provided in a surface of said region;

wherein said first diffused part is connected to a power line for said at least one transistor, and said second diffused part is connected to an external terminal.

2. A protective circuit for a semiconductor integrated circuit according to claim 1, wherein said second diffused part is connected to a signal line between said external terminal and said MOS transistors.

3. A protective circuit for a semiconductor integrated circuit according to claim 1, wherein said first conducting type protective device region is in an electrically floating condition.

4. A protective circuit for a semiconductor integrated circuit, comprising:

at least one transistor provided on a substrate;

a first conducting type region provided on said substrate; and a second conducting type first diffused part and second diffused part provided in a surface of said region;

wherein said first diffused part is connected to a ground line for said at least one transistor, and said second diffused part is connected to an external terminal.

5. A protective circuit for a semiconductor integrated circuit according to claim 4, wherein said second diffused part is connected to a signal line between said external terminal and said MOS transistors.

6. A protective circuit for a semiconductor integrated circuit according to claim 4, wherein said first conducting type protective device region is in an electrically floating condition.

7. A protective circuit for a semiconductor integrated circuit, comprising:

at least one transistor provided on a substrate;

a first conducting type first protective device region provided on said substrate;

a second conducting type first diffused part and second diffused part provided in a surface of said first protective device region;

a first conducting type second protective device region provided on said substrate; and a second conducting type third diffused part and fourth diffused part provided in a surface of said second protective device region;

wherein said first diffused part is connected to a power line of said at least one transistor, and said second diffused part is connected to an external terminal; and said third diffused part is connected to a ground line of said at least one transistor, and said fourth diffused part is connected to said external terminal.

8. A protective circuit for a semiconductor integrated circuit according to claim 7, wherein said second diffused part and said fourth diffused part are connected to a signal line between said external terminal and said MOS transistors.

9. A protective circuit for a semiconductor integrated circuit according to claim 7, wherein said first conducting type first protective device region and said first conducting type second protective device region are in an electrically floating condition.

10. A protective circuit for a semiconductor integrated circuit, comprising:

at least one transistor provided on a substrate;

a first conducting type first protective device region provided on said substrate;

a second conducting type first diffused part and second diffused part provided in a surface of said first protective device region;

a first conducting type second protective device region provided on said substrate; and a second conducting type third diffused part and fourth diffused part provided in a surface of said second protective device region;

wherein said first diffused part is connected to an input signal line of a pull-up transistor, and said second diffused part is connected to an external terminal; and said third diffused part is connected to an input signal line of a pull-down transistor, and said fourth diffused part is connected to said external terminal.

11. A protective circuit for a semiconductor integrated circuit according to claim 10, wherein said first conducting type protective device region is in an electrically floating condition.

* * * * *